United States Patent [19]
Jeong et al.

[11] Patent Number: 6,094,080
[45] Date of Patent: Jul. 25, 2000

[54] INTERNAL CLOCK SIGNAL GENERATOR FOR SYNCHRONOUS MEMORY DEVICE

[75] Inventors: Se-jin Jeong, Seoul; Il-man Bae, Suwon, both of Rep. of Korea

[73] Assignee: Samsung Electronics, Co., Ltd., Suwon, Rep. of Korea

[21] Appl. No.: 08/961,051

[22] Filed: Oct. 30, 1997

[30] Foreign Application Priority Data

Oct. 30, 1996 [KR] Rep. of Korea ............... 96-50486

[51] Int. Cl.[7] ................................................ H03K 7/08
[52] U.S. Cl. .................... 327/176; 327/271; 327/291; 365/233.5; 326/93
[58] Field of Search .......................... 327/176, 175, 327/291, 270, 271, 286, 281, 113–116, 361, 269; 365/233, 233.5; 326/93

[56] References Cited

U.S. PATENT DOCUMENTS

| | | | |
|---|---|---|---|
| 5,280,203 | 1/1994 | Hung | 326/37 |
| 5,444,405 | 8/1995 | Troung | 327/239 |
| 5,489,867 | 2/1996 | Tamanoi | 327/269 |
| 5,719,515 | 2/1998 | Danger | 327/270 |
| 5,786,715 | 7/1998 | Halepete | 327/116 |

FOREIGN PATENT DOCUMENTS 3-102911  4/1991  Japan .

*Primary Examiner*—Timothy P. Callahan
*Assistant Examiner*—Minh Nguyen
*Attorney, Agent, or Firm*—Marger Johnson & McCollom, P.C.

[57] ABSTRACT

An internal clock signal generator of a synchronous memory device is provided. The internal clock signal generator includes first and second inverting portions, a delay portion, first and second switching portions, and first and second logic portions also called input and output logic circuits, respectively. The first inverting portion inverts an external clock signal. The second inverting portion inverts an output signal of the first inverting portion. The delay portion delays an output signal of the second inverting portion. The first switching portion gates an output signal of the delay portion in response to a first control signal. The second switching portion gates the output signal of the second inverting portion in response to a second control signal. The first or input logic portion performs a logic operation with respect to signals input from an external source and outputting the first and second control signals. The second or output logic portion receives a signal transmitted through a selected one of the first and second switching portions and the output signal from the first inverting portion, performs a logic operation with respect to the received signals, and outputs the internal clock signal.

18 Claims, 2 Drawing Sheets

INTERNAL CLOCK SIGNAL GENERATOR FOR SYNCHRONOUS MEMORY DEVICE

BACKGROUND OF THE INVENTION

1. Field of the Invention

The present invention relates to semiconductor memory devices, and more particularly, to an internal clock signal generating circuit for a synchronous memory device.

2. Description of the Related Art

Known memory devices, in particular, DRAM, include asynchronous DRAM and synchronous DRAM (hereinafter, referred to as SDRAM). The internal signals in the SDRAM are synchronized with external clock signals input from an external CPU. Thus the SDRAM generates internal clock signals having a predetermined pulse width synchronized with respect to the external clock signals.

FIG. 1 is a circuit diagram of a conventional internal clock signal generator of an SDRAM. Referring to the drawing, the conventional internal clock signal generator includes: an inverter I1 for inverting an external clock signal (Clock) input thereto by an external CPU; a delay portion 1 for delaying the output from the inverter I1; and a NAND gate ND1 for performing a NAND operation with respect to the outputs of the inverter I1 and the delay portion 1 and outputting an internal clock signal (Pclock). The delay portion 1 includes a series of inverters I2 to I7. The phase of the internal clock signal (Pclock) is determined by the state of the external clock signal (Clock). Here, a detailed description of the operation of the conventional internal clock signal generator is omitted.

FIGS. 2 and 3 are timing diagrams for the conventional internal clock signal generator shown in FIG. 1. FIG. 2 shows a case in which the cycle of the external clock signal (Clock) is relatively long. FIG. 3 shows a case in which the cycle of the external clock signal (Clock) is relatively short—in both cases relative to the Pclock logic-low pulse width FIG. 4 shows an example of a circuit using an internal clock signal in an SDRAM. A problem with the conventional internal clock signal generator of FIG. 1 will be described with reference to FIG. 4.

Referring to FIG. 4, when an internal clock signal (Pclock) is toggled to a logic "high", an input signal (Input), input through a transmission gate TM1 is stored in a latch 3. When the internal clock signal (Pclock) is toggled to a logic "low", the signal stored in the latch 3 is output through a transmission gate TM2 and stored in a latch 5, and then output as an output signal (Output). In order to accurately transmit the input signal (Input) as the output signal (Output), the pulse width of the internal clock signal (Pclock) must be longer than the input and output response times of the transistors used in FIG. 4. However, in the conventional internal clock signal generator, as shown in the timing diagram of FIG. 3, when the cycle of the external clock signal (Clock) is short (i.e. high frequency), the Pclock "low" pulse width is reduced. If the cycle of the external clock signal (clock) is extremely shortened, the "low" pulse width of the internal clock signal (Pclock) can disappear entirely. Thus, when the "low" pulse width of the internal clock signal (Pclock) is shorter than the input and output response times of the transistors used in FIG. 4, the input signal (Input) is not accurately transmitted as the output signal (Output), and a malfunction occurs.

SUMMARY OF THE INVENTION

Accordingly, it is an object of the present invention to provide an internal clock signal generator for a synchronous memory device by which the pulse width of an internal clock signal is adjusted responsive to the cycle of an external clock signal.

To accomplish the above object, there is provided an internal clock signal generator for a synchronous memory device comprising: first and second inverting portions, a delay portion, first and second switching portions, and first and second logic portions. The first inverting portion inverts an external clock signal. The second inverting portion inverts an output signal of the first inverting portion. The delay portion delays an output signal of the second inverting portion. The first switching portion gates an output signal of the delay portion in response to a first control signal. The second switching portion gates the output signal of the second inverting portion in response to a second control signal. The first logic portion performs a logic operation with respect to signals input from an external source and outputting the first and second control signals. The second logic portion receives a signal transmitted through a selected one of the first and second switching portions and the output signal from the first inverting portion, performs a logic operation with respect to the received signals, and outputs the internal clock signal.

According to a preferred embodiment, the delay portion comprises an even number of inverters connected to each other in series. The first switching portion transmits the output signal of said delay portion when the first control signal is logic "high". The first switching portion is comprised of a transmission gate. The second switching portion transmits the output signal of the second inverting portion when the second control signal is logic "high". The second switching portion is comprised of a second transmission gate. The first or input logic portion comprises a NOR gate for receiving the input signals, performing a NOR operation with respect to the received signals, and outputting the first control signal, and an inverter for inverting the first control signal and outputting the second control signal.

The second logic portion comprises an inverter for inverting the output signal transmitted through a selected one of the first and second switching portions, and a NAND gate for receiving the output signals from the inverter and the first inverting portion, performing a NAND operation with respect to the received signals, and outputting the internal clock signal.

BRIEF DESCRIPTION OF THE DRAWINGS

The above object and advantage of the present invention will become more apparent by describing in detail a preferred embodiment thereof with reference to the attached drawings in which.

DETAILED DESCRIPTION OF THE INVENTION

Figure 1:
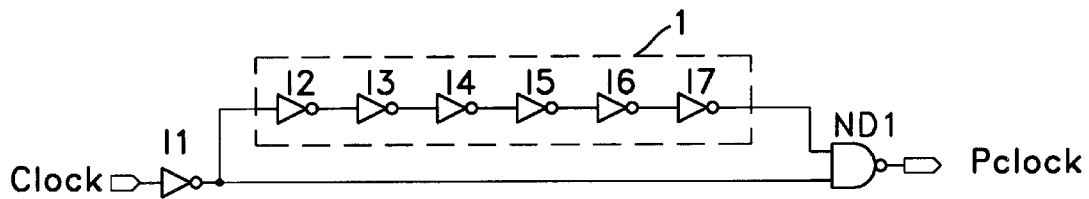
FIG. 1 is a circuit diagram of a conventional internal clock signal generator for a SDRAM.
Figure 2:
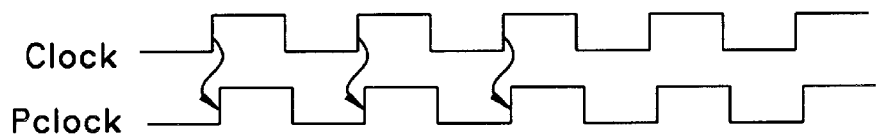
FIG. 2 is an operational timing diagram for the circuit shown in FIG. 1 when the cycle of an external clock signal is long.
Figure 3:
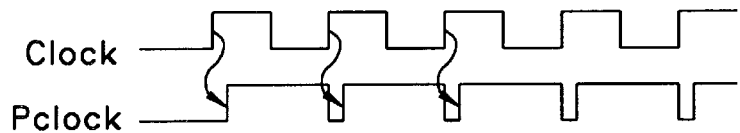
FIG. 3 is an operational timing diagram for the circuit shown in FIG. 1 when the cycle of an external clock signal is short.
Figure 4:
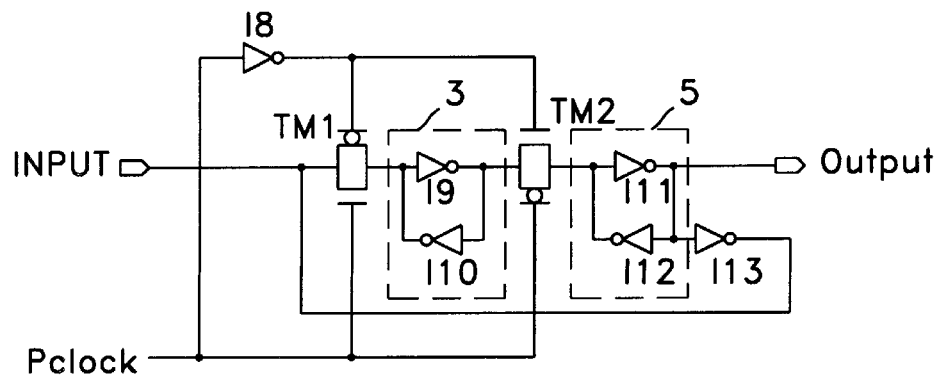
FIG. 4 shows an example of a circuit using an internal clock signal in the SDRAM.
Figure 5:
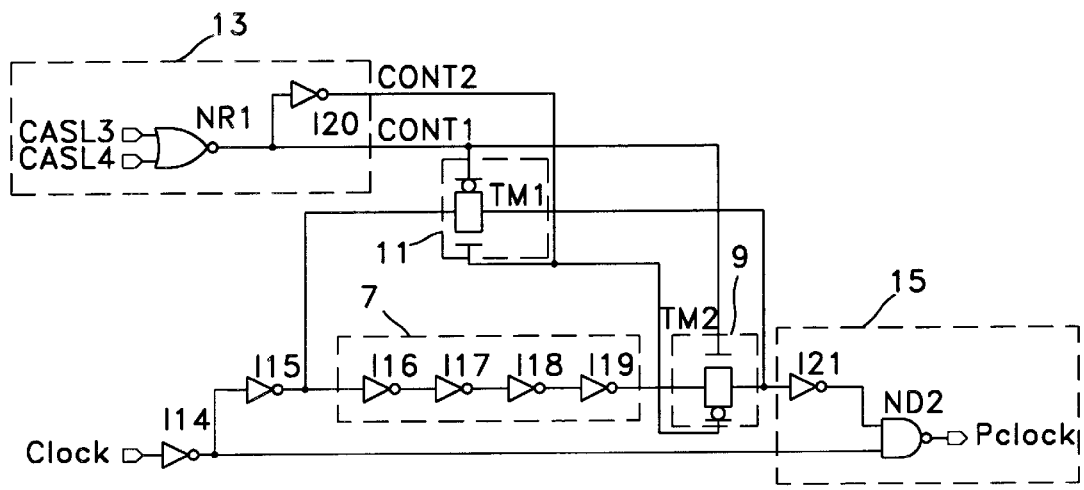
FIG. 5 is a circuit diagram of an internal clock signal generator for a SDRAM according to an embodiment of the present invention.

Referring to FIG. 5, an internal clock signal generator according to an embodiment of the present invention includes: a first inverting portion I14 for inverting an external clock signal (Clock) input thereto by an external CPU; a second inverting portion I15 for inverting an output signal of the first inverting portion I14; a delay portion 7 for delaying an output signal of the second inverting portion I15; a first switching portion 9 for transmitting an output signal of the delay portion 7 by responding to a first control signal (CONT1); a second switching portion 11 for transmitting an output signal of the second inverting portion I15 by responding to a second control signal (CONT2); a first logic portion 13 for receiving predetermined input signals CASL3 and CASL4 from an external source, performing a logic operation with respect to the received signals, and outputting first and second control signals CONT1 and CONT2; and a second logic portion 15 for receiving a signal transmitted through either of the first and second switching portions 9 and 11 and an output signal of the first inverting portion I14, performing a logic operation with respect to the received signals, and outputting the internal clock signal (Pclock).

The first and second inverting portions I14 and I15 each include an inverter. The delay portion 7 includes an even number of inverters. By way of illustration, there are four, I16 to I19, which are connected to each other in series. The first and second switching portions 9 and 11 include transmission gates TM2 and TM1, respectively. The first logic portion 13 includes a NOR gate NR1 for receiving first and second input signals CASL3 and CASL4 from an external source, performing a NOR operation with respect to the received signals, and outputting the first control signal CONT1, and an inverter I20 for inverting an output of the NOR gate NR1 and outputting the second control signal CONT2. The second logic portion 15 includes an inverter I21 for inverting a signal transmitted through either of the first and second switching portions 9 and 11 according to the first and second control signals CONT1 and CONT2. The second logic circuit further includes a NAND gate ND2 for receiving signals output from the inverter I21 and the first inverting portion I14, performing a NAND operation with respect to the received signals, and outputting the internal clock signal (Pclock).

In one application of the present invention, the first and second input signals CASL3 and CASL4 input from the external source are column address strobe (CAS) latency information. For example, in case that data is output from a third rising edge of the external clock signal (Clock) after the SDRAM receives a read command, the CAS latency is 3. The CAS latency varies from one memory to another.

Figure 6:
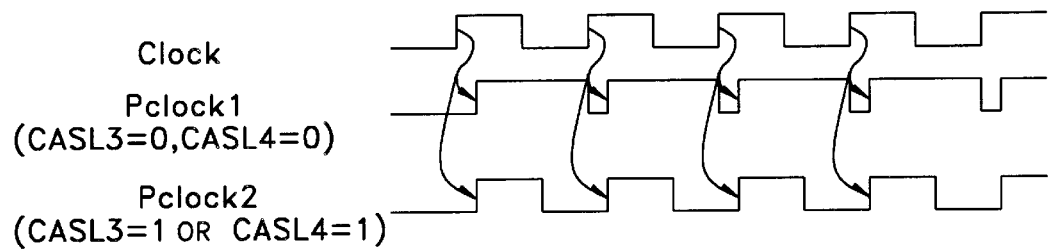
FIG. 6 is an operational timing diagram for the circuit shown in FIG. 5.

FIG. 6 is an operational timing diagram for the device shown in FIG. 5. Hereinbelow, the operation of an internal clock signal generator according to an embodiment of the present invention will be described with respect to the operational timing diagram of FIG. 6. When the CAS latency information is not input, i.e., the first and second input signals CASL3 and CASL4 are logic "low", the first and second control signals CONT1 and CONT2 of the first logic portion 13 become logic "high" and logic "low", respectively. Accordingly, the first switching portion 9 is activated, and the second switching portion 11 is deactivated. Thus, when the external clock signal (Clock) is input, it is inverted in the first inverting portion I14 and input to an input port of the NAND gate ND2 of the second logic portion 15. Also, the inverted clock signal (Clock) is delayed by a predetermined amount of time through the second inverting portion I15, the delay portion 7, the first switching portion 9, and the inverter I21 of the second logic portion 15, and input to the other input port of the NAND gate ND2. Accordingly, the NAND gate ND2 performs a NAND operation with respect to the signals input thereto and outputs an internal clock signal (Pclock 1) having a short "low" pulse width as shown in the timing diagram of FIG. 6.

When the CAS latency information is input, i.e., the first or second input signals CASL3 or CASL4 are logic "high", the first and second control signals CONT1 and CONT2 of the first logic portion 13 become logic "low" and logic "high", respectively. Accordingly, the first switching portion 9 is deactivated and the second switching portion 11 is activated. Thus, when the external clock signal (Clock) is input, it is inverted through the first inverting portion I14 and input to an input port of the NAND gate ND2 of the second logic portion 15. Also, the inverted clock signal is input to the other input port of the NAND gate ND2 through the second inverting portion I15, the second switching portion 11, and the inverter I21 of the second logic portion 15. In this case, since the clock signal does not pass through the delay portion 7, an internal clock signal (Pclock2) having a long "low" pulse width as shown in the timing diagram of FIG. 6 is output.

In the internal clock signal generator for a synchronous memory device according to the present invention, the pulse width of the internal clock signal is adjusted according to the cycle of the external clock signal, i.e. even when the cycle of the external clock signal is shorter, an external clock signal having an almost identical "high" pulse width and "low" pulse width is generated. Thus, a malfunction of the synchronous memory device is prevented. The present invention is not limited to the embodiment, and various modifications may be effected within the range of the present invention.

What is claimed is:

1. A synchronous memory device, including an internal clock generator comprising:

a first inverting means for inverting an external clock signal;

a second inverting means for inverting an output signal of said first inverting means;

a delay means for delaying an output signal of said second inverting means;

means for selecting either the output signal of the second inverting means or the output signal of the delay means responsive to a control signal for CAS latency information, thereby generating a selected output signal; and output logic means for combining the selected output signal and the output signal from the first inverting means to form an internal clock signal; and wherein the memory device further includes internal circuitry coupled to receive the internal clock signal such that internal signals in the memory device are synchronized with the external clock signal.

2. A synchronous memory device according to claim 1 wherein the selecting means includes:

a first switching means for gating the output signal of the delay means in response to the control signal; and a second switching means for gating the output signal of the second inverting means in response to the control signal.

3. A synchronous memory device according to claim 2, wherein said delay means comprises an even number of inverters connected to each other in series.

4. A synchronous memory device according to claim 2, wherein said first switching means transmits the output signal of said delay means when the control signal is logic "high".

5. A synchronous memory device according to claim 4, wherein said first switching means is comprised of a transmission gate.

6. A synchronous memory device according to claim 2, wherein said second switching means transmits the output signal of said second inverting means when the control signal is logic "low".

7. A synchronous memory device according to claim 6, wherein said second switching means is comprised of a transmission gate.

8. An internal clock signal generator according to claim 1 wherein the selecting means includes:
   means for selecting the output signal from the delay means when CAS latency information is not input to the selecting means; and
   means for selecting the output signal from the second inverting means when CAS latency information is input to the selecting means.

9. A synchronous memory device including an internal clock generator comprising:
   a first inverting means for inverting an external clock signal;
   a second inverting means for inverting an output signal of said first inverting means;
   a delay means for delaying an output signal of said second inverting means;
   means for selecting either the output signal of the second inverting means or the output signal of the delay means responsive to a control signal for CAS latency information, thereby generating a selected output signal;
   output logic means for combining the selected output signal and the output signal from the first inverting means to form an internal clock signal, wherein the selecting means includes: a first switching means for gating the output signal of the delay means in response to the control signal, and a second switching means for gating the output signal of the second inverting means in response to the control signal; and
   input logic means having at least one input for receiving an input logic signal responsive to column address strobe latency and forming the control signal responsive to the input logic signal.

10. A synchronous memory device according to claim 8 wherein the input logic means includes a logic gate for receiving first and second input logic signals indicative of column address strobe latency.

11. An internal clock signal generator for a synchronous memory device comprising:
    a first inverting means for inverting an external clock signal;
    a second inverting means for inverting an output signal of said first inverting means;
    a delay means for delaying an output signal of said second inverting means;
    means for selecting either the output signal of the second inverting means or the output signal of the delay means responsive to a control signal for CAS latency information, thereby generating a selected output signal;
    output logic means for combining the selected output signal and the output signal from the first inverting means to form an internal clock signal; and
    input logic means having at least one input for receiving an input logic signal responsive to column address strobe latency and forming the control signal responsive to the input logic signal;
    wherein the selecting means selects the output signal from the delay means when CAS latency information is not input to the selecting means and selects the output signal from the second inverting means when CAS latency information is input to the selecting means;
    wherein the selecting means includes:
      a first switching means for gating the output signal of the delay means in response to the control signal; and
      a second switching means for gating the output signal of the second inverting means in response to the control signal; and
    wherein said input logic means comprises a NOR gate for receiving two input signals, performing a NOR operation with respect to the received input signals, and outputting a first control signal, and an inverter for inverting the first control signal and outputting a second control signal, and wherein the selecting means is responsive to the first and second control signals.

12. An internal clock signal generator for a synchronous memory device comprising:
    a first inverting means for inverting an external clock signal;
    a second inverting means for inverting an output signal of said first inverting means;
    a delay means for delaying an output signal of said second inverting means;
    means for selecting either the output signal of the second inverting means or the output signal of the delay means responsive to a control signal for CAS latency information, thereby generating a selected output signal; and
    output logic means for combining the selected output signal and the output signal from the first inverting means to form an internal clock signal;
    wherein the selecting means selects the output signal from the delay means when CAS latency information is not input to the selecting means and selects the output signal from the second inverting means when CAS latency information is input to the selecting means; and
    wherein said output logic means comprises an inverter for inverting the selected output signal and a NAND gate for receiving the output signals from said inverter and said first inverting means, performing a NAND operation with respect to the received signals, and outputting the internal clock signal.

13. A method for generating an internal clock signal in a synchronous memory device, the method comprising the steps of:
    receiving an external clock signal;
    inverting the external clock signal to form a first inverted clock signal;
    inverting the first inverted clock signal to form a second inverted clock signal;
    delaying the second inverted clock signal to form a delayed clock signal;
    responsive to at least one external input logic signal for CAS latency information, selecting either the second inverted clock signal when CAS latency information is received or the delayed clock signal when CAS latency information is not received to form a selected clock signal;

combining the first inverted clock signal and the selected clock signal to form the internal clock signal; and driving internal signals in the synchronous memory device with the internal clock signal, thereby synchronizing the memory device with the external clock signal.

14. A method for generating an internal clock signal according to claim 13 wherein;

the external input logic signal is indicative of column address strobe latency.

15. A method for generating an internal clock signal according to claim 13 wherein the synchronous memory device is a synchronous DRAM device.

16. A method for generating an internal clock signal in a synchronous memory device having a CAS latency, the method comprising the steps of:

receiving an external clock signal;

receiving one or more control signals which represent the CAS latency;

generating a first edge of the internal clock signal responsive to a first edge of the external clock signal such that the first edge of the internal clock signal occurs a first amount of time after the first edge of the external clock signal, and the frequency of the internal clock signal is always the same as the frequency of the external clock signal regardless of the state of the one or more control signals;

generating a second edge of the internal clock signal responsive to the first edge of the external clock signal such that the second edge of the internal clock signal occurs a second amount of time after the first edge of the external clock signal;

varying the second amount of time responsive to the one or more control signals, thereby varying a pulse width between the first and second edges of the internal clock signal; and driving internal signals in the synchronous memory device with the internal clock signal, thereby synchronizing the memory device with the external clock signal.

17. A method according to claim 16 wherein:

the first edge of the internal clock signal is a rising edge; and the second edge of the internal clock signal is a falling edge.

18. A method according to claim 16 wherein the internal clock signal has the same frequency as the external clock signal.

* * * * *